United States Patent
Cheng et al.

(10) Patent No.: US 8,664,718 B2
(45) Date of Patent: Mar. 4, 2014

(54) POWER MOSFETS AND METHODS FOR FORMING THE SAME

(75) Inventors: Chih-Chang Cheng, Hsin-Chu (TW); Fu-Yu Chu, Hsin-Chu (TW); Ruey-Hsin Liu, Hsin-Chu (TW); Hsiao-Chin Tuan, JuDong Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 79 days.

(21) Appl. No.: 13/348,463

(22) Filed: Jan. 11, 2012

(65) Prior Publication Data
US 2013/0134512 A1 May 30, 2013

Related U.S. Application Data

(60) Provisional application No. 61/565,177, filed on Nov. 30, 2011.

(51) Int. Cl.
*H01L 29/66* (2006.01)
(52) U.S. Cl.
USPC .................................. 257/343; 257/E29.256
(58) Field of Classification Search
USPC .................................. 257/343, 488, E29.256
See application file for complete search history.

(56) References Cited

U.S. PATENT DOCUMENTS

| 4,290,077 | A | 9/1981 | Ronen | |
|---|---|---|---|---|
| 6,664,593 | B2 * | 12/2003 | Peake | 257/336 |
| 6,664,596 | B2 * | 12/2003 | Cai et al. | 257/343 |
| 2008/0296702 | A1 | 12/2008 | Lee et al. | |

FOREIGN PATENT DOCUMENTS

KR    1020020011646    2/2002

* cited by examiner

*Primary Examiner* — Mark Prenty
(74) *Attorney, Agent, or Firm* — Slater & Matsil, L.L.P.

(57) ABSTRACT

A power MOSFET includes a semiconductor region extending from a top surface of a semiconductor substrate into the semiconductor substrate, wherein the semiconductor region is of a first conductivity type. A gate dielectric and a gate electrode are disposed over the semiconductor region. A drift region of a second conductivity type opposite the first conductivity type extends from the top surface of the semiconductor substrate into the semiconductor substrate. A dielectric layer has a portion over and in contact with a top surface of the drift region. A conductive field plate is over the dielectric layer. A source region and a drain region are on opposite sides of the gate electrode. The drain region is in contact with the first drift region. A bottom metal layer is over the field plate.

20 Claims, 7 Drawing Sheets

POWER MOSFETS AND METHODS FOR FORMING THE SAME

This application claims the benefit of the following provisionally filed U.S. Patent application: Application Ser. No. 61/565,177, filed Nov. 30, 2011, and entitled "Power MOSFETs and Methods for Forming the Same;" which application is hereby incorporated herein by reference.

BACKGROUND

Power Metal-Oxide-Semiconductor Field-Effect Transistors (MOSFETs) include drift regions, which are lightly doped with a p-type or an n-type impurity. The concentrations of the drift regions are low, so that the breakdown voltages of the power MOSFETs are increased. A conventional MOSFET has a Shallow Trench Isolation (STI) region extending below the respective gate electrode. A drain-side drift region extends underlying the gate electrode, and adjoins a channel region that has an opposite conductivity type than the drain-side drift region. The channel region also extends underlying the gate electrode.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

Power Metal-Oxide-Semiconductor Field-Effect Transistors (MOSFETs) and the methods of forming the same are provided in accordance with various exemplary embodiments. The intermediate stages of forming the power MOSFETs are illustrated. The variations of the power MOSFETs in accordance with embodiments are discussed. Throughout the various views and illustrative embodiments, like reference numbers are used to designate like elements.

Figure 1:
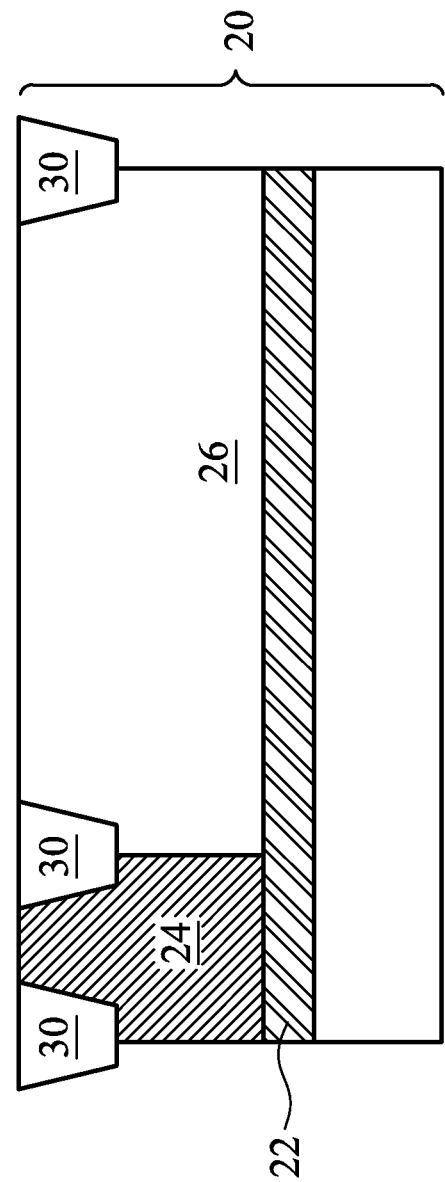
FIGS. 1 through 7 are cross-sectional views of intermediate stages in the manufacturing of power Metal-Oxide-Semiconductor Field-Effect Transistors (MOSFETs) in accordance with some exemplary embodiments.

Referring to FIG. 1, semiconductor substrate 20 is provided. Semiconductor substrate 20 may comprise crystalline silicon or other semiconductor materials such as silicon germanium, silicon carbon, or the like. N+ Buried Layer (NBL) 22 is formed in a portion of the substrate 20, wherein NBL is proximate, and below, the top surface of substrate 20. NBL 22 may be formed by implanting an n-type dopant into an intermediate region of substrate 20. For example, NBL 22 may be formed by implanting phosphorous to a concentration between about $1\times10^{17}/cm^3$ and about $1\times10^{19}/cm^3$, or to a higher concentration. Alternatively, other n-type dopants such as arsenic and antimony may be implanted. In some alternative embodiments, NBL 22 is formed by implanting a surface portion of original substrate 20, and then epitaxially growing a semiconductor layer over NBL 22. Regions 24 and 26 are then formed in the epitaxy semiconductor layer through implantations.

N-Well region 24 is formed in substrate 20, and extends from the top surface of substrate 20 down to contact NBL 22. N-well region 24 may be formed, for example, by implanting an n-type impurity into substrate 20. P-type region 26 is also formed over NBL 22, and may extend from the top surface of substrate 20 to NBL 22. P-type region 26 may have a concentration between about $10^{15}/cm^3$ and about $10^{17}/cm^3$, although a higher or a lower concentration may be used. The edge of N-well region 24 contacts the edge of p-type region 26. It is noted that although only one side of N-well region 24 is illustrated, in a top view of the structure in FIG. 1, N-well region 24 may have a ring shape (for example, a rectangular ring shape), and encircles P-type region 26.

Insulation regions 30 are also formed to extend from the top surface of substrate 20 into substrate 20. Insulation regions 30 may be Shallow Trench Isolation (STI) regions, and hence are referred to as STI regions 30 hereinafter, although they may also be other types of insulation regions such as field oxide regions. The field oxide regions may comprise a thermal oxide of silicon, which may be formed through local oxidation of silicon substrate 20.

Figure 2:
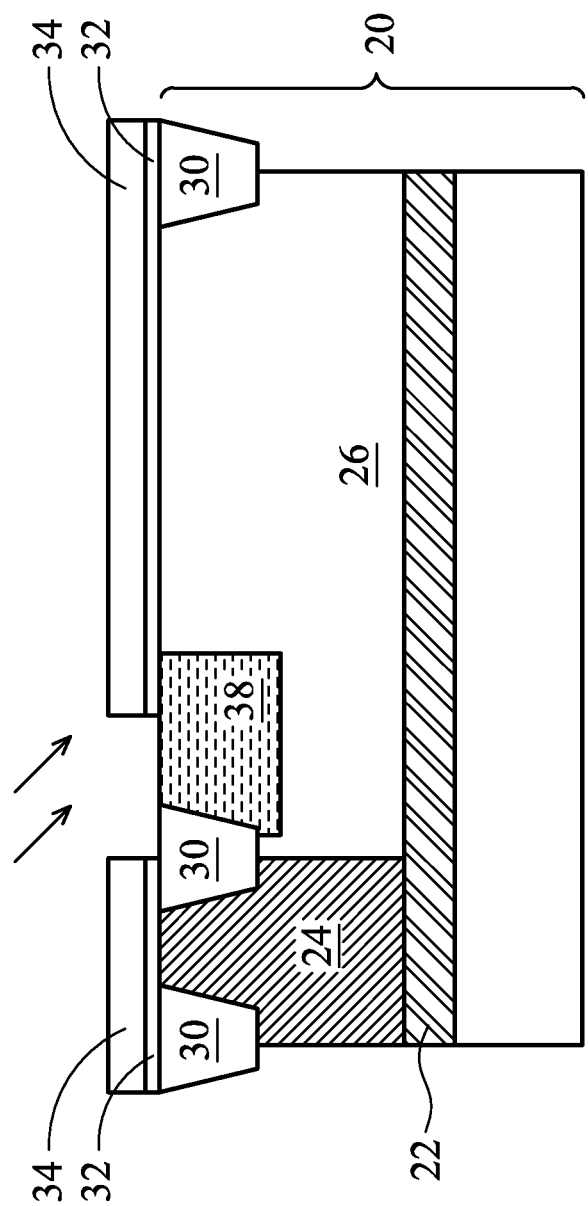

FIG. 2 shows the formation of gate dielectric 32 and gate electrode 34 in accordance with embodiments. In some embodiments, gate dielectric 32 is deposited to cover portions of P-type region 26. Gate dielectric 32 may comprise silicon oxide, silicon nitride, a high-k dielectric material, multi-layers thereof, or combinations thereof. Gate electrode 34 is deposited over gate dielectric 32. Gate electrode 34 comprises a conductive material such as doped polysilicon, a metal, a metal alloy, or the like. In a first patterning step, gate dielectric 32 and gate electrode 34 are patterned, so that a portion of P-type region 26 is exposed. An implantation is then performed to dope the exposed portion of P-type region 26, so that P-body 38 is formed. In some exemplary embodiments, P-body 38 has a p-type impurity concentration higher than the impurity concentration of P-type region 26. For example, the p-type impurity concentration of P-body 38 may be between about $10^{16}/cm^3$ and about $10^{18}/cm^3$, although a higher or a lower impurity concentration may be adopted. The implantation may be tilted, so that P-body 38 extends directly underlying gate electrode 34.

Figure 3:
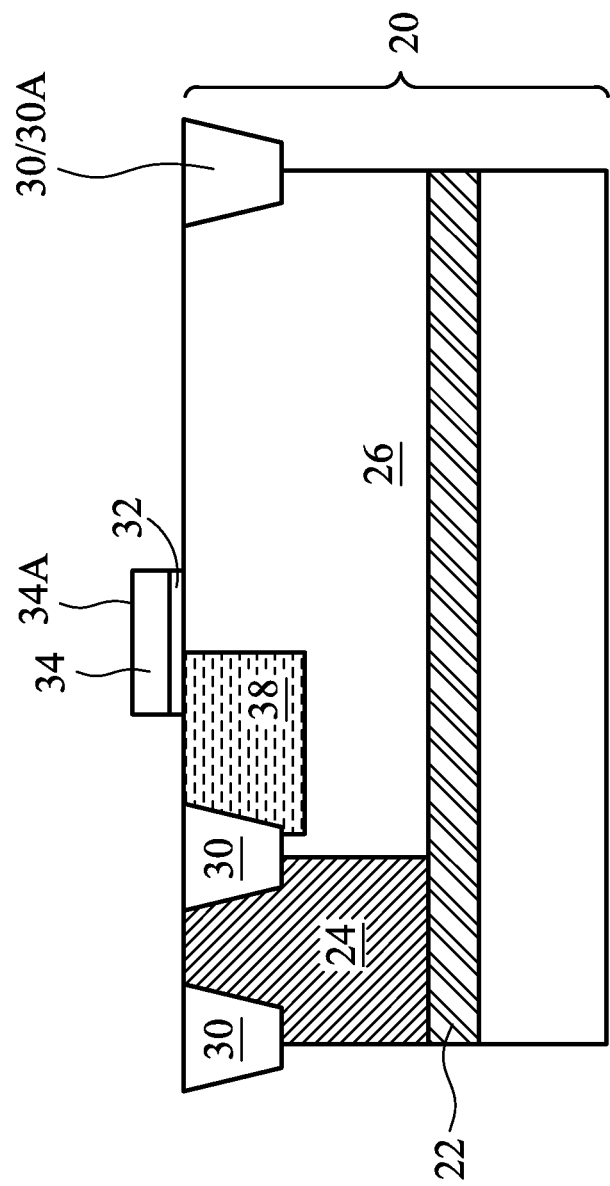

After the formation of P-body 38, a second patterning is performed, and gate dielectric 32 and gate electrode 34 are further patterned. The resulting structure is shown in FIG. 3. In the resulting structure, gate electrode 34 includes edge 34A, which is spaced apart from the nearest STI region 30 (also marked as 30A to distinguish it from other STI regions 30) by a portion of P-type region 26.

Figure 4:
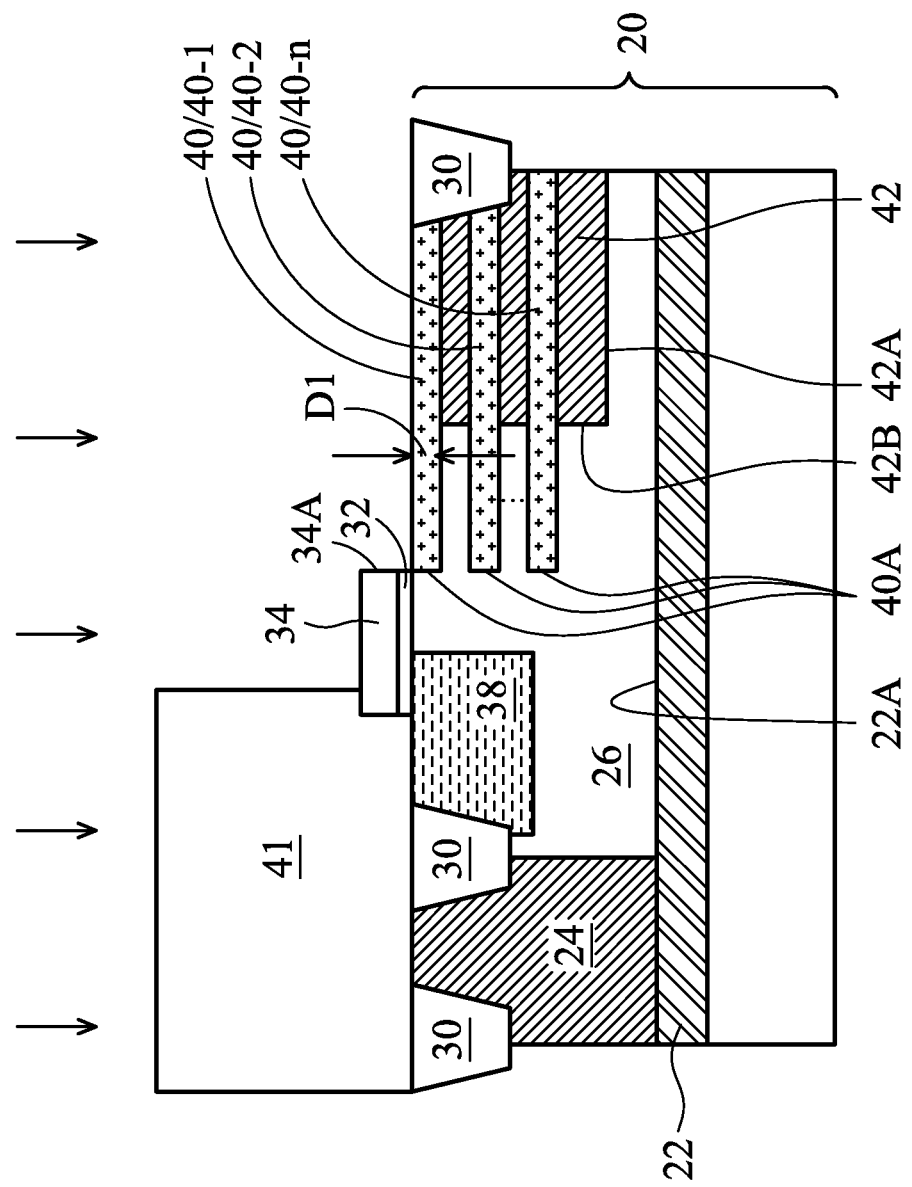

Next, referring to FIG. 4, one or a plurality of implantations is performed to form N-type drift region(s) 40. In some embodiments, N-type drift region(s) 40 include a single N-type drift region (marked as 40-1) only. Alternatively, N-type drift regions 40 include a plurality of N-type drift regions, which are marked as 40-1 through 40-n, wherein integer "n" is greater than 1, and may be equal to 2, 3, 4, 5, or greater. The net n-type impurity concentration of N-type drift regions 40 may be between about $10^{15}/cm^3$ and about $10^{17}/cm^3$, although higher or lower impurity concentrations may be adopted. To form N-type drift regions 40, photo resist 41 may be formed to cover P-body 38 and other regions that are not to be implanted. After the formation of N-type drift regions 40, photo resist 41 is removed. N-type drift region 40-1 extends from the top surface of substrate 20 into substrate 20. Since the implantations of N-type drift regions 40 are performed using gate electrode 34 as an implantation mask, inner edges 40A of N-type drift regions 40 are substantially aligned to edge 34A of gate electrode 34. As a result, the capacitance between gate electrode 34 and N-type drift regions 40 is minimized. In some exemplary embodiments, depth D1 of N-type drift region 40-1 is between about 0.02 μm and about 1 μm.

As also shown in FIG. 4, additional N-type drift regions such as 40-2 through 40-n may also be formed, for example, through additional implantation steps, which are performed using implantation energies higher than the implantation energy for forming N-type drift region 40-1. The total count n of N-type drift regions 40 partially depends on the desirable breakdown voltage of the respective resulting power MOSFET 100 (FIG. 7), and a greater breakdown voltage may be achieved by decreasing the total count n of N-type drift regions 40.

In some embodiments, N-type drift regions 40-1 through 40-n are spaced apart from each other by portions of P-type region 26 that are inserted between N-type drift regions 40. Accordingly, N-type drift regions 40-2 through 40-n may be electrically floating and isolated from each other by portions of P-type region 26.

In other embodiments, N-well region 42 may be formed, for example, through an implantation. N-well region 42 may be formed on the right side of N-type drift regions 40, with the left edge of N-well region 42 contacting the right edges of N-type drift regions 40. Alternatively, N-well region 42 may overlap the right portions of N-type drift regions 40. Accordingly, in the overlap regions of N-well region 42 and N-type drift regions 40, the doping concentration is the sum of the doping concentrations of N-well region 42 and N-type drift regions 40. The n-type doping concentration of N-well region 42 may be slightly higher than that of N-type drift regions 40. The formation of N-well region 42 may require an additional photo resist, which is not shown in the Figures. Bottom surface 42A of N-well region 42 may be spaced apart from top surface 22A of NBL 22 by a portion of P-type region 26. Alternatively, bottom surface 42A of N-well region 42 may be in contact with top surface 22A of NBL 22. N-well region 42 may be joined with N-type drift regions 40-1 through 40-n, so that all of N-type drift regions 40 are electrically coupled together. The inner edge 42B of N-well region 42 may be spaced apart from edge 40A of N-type drift region 40-1. Accordingly, N-well region 42 is spaced apart from gate electrode 34 by a portion of N-type drift region 40-1.

Figure 5:
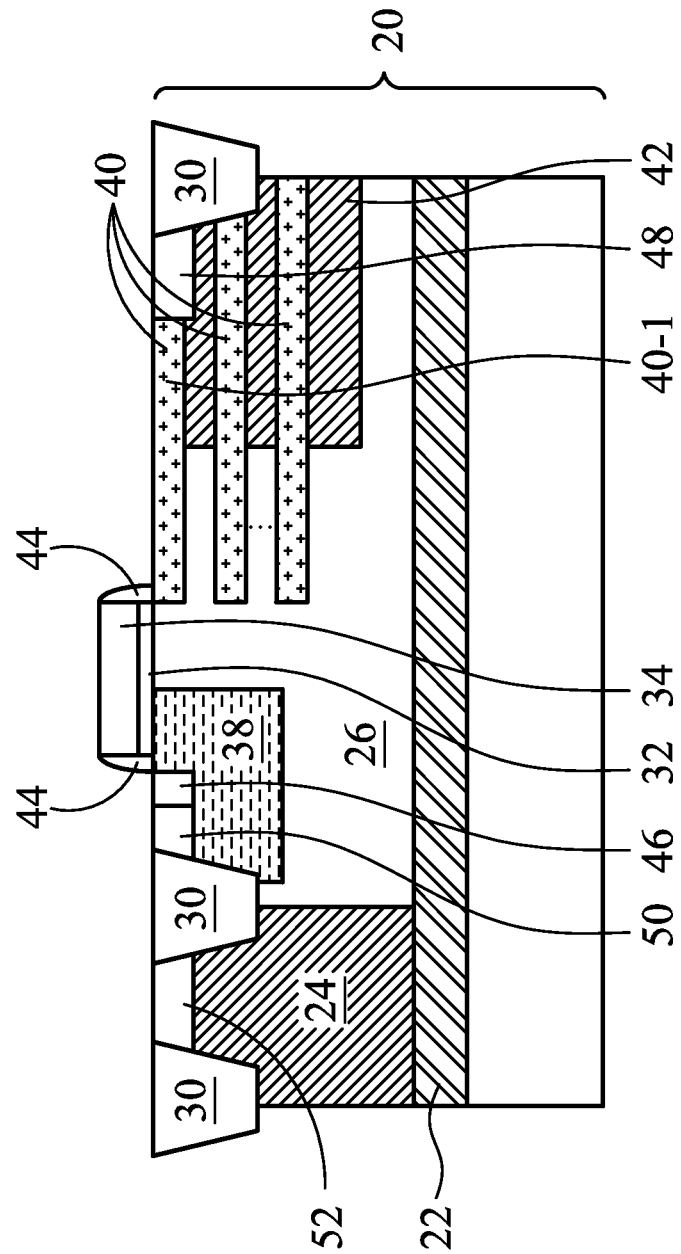

FIG. 5 illustrates the formation of gate spacers 44 on the edges of gate dielectric 32 and gate electrode 34. Source region 46 is then formed in P-body 38, which is on the source side of the respective power MOSFET. Drain region 48 is formed on the drain side of the power MOSFET, and extends into N-type drift region 40-1. Drain region 48 may, or may not, extend into N-type drift regions 40-2 through 40-n. P-type pickup region 50 is also formed in P-body 38. N-type pickup region 52 is formed in N-well region 24 to act as the pickup region of N-well region 24 and NBL 22. Source region 46, drain region 48, and pickup region 52 may be formed by implanting an n-type dopant such as phosphorous to a concentration between about $1 \times 10^{19}/cm^3$ and about $2 \times 10^{21}/cm^3$, for example. Alternatively, other n-type dopants such as arsenic, antimony, or combinations thereof, may also be used. P-type pickup region 50 may be formed by implanting a p-type dopant such as boron, indium, or the like to a concentration between about $1 \times 10^{19}/cm^3$ and about $2 \times 10^{21}/cm^3$, for example.

Figure 6:
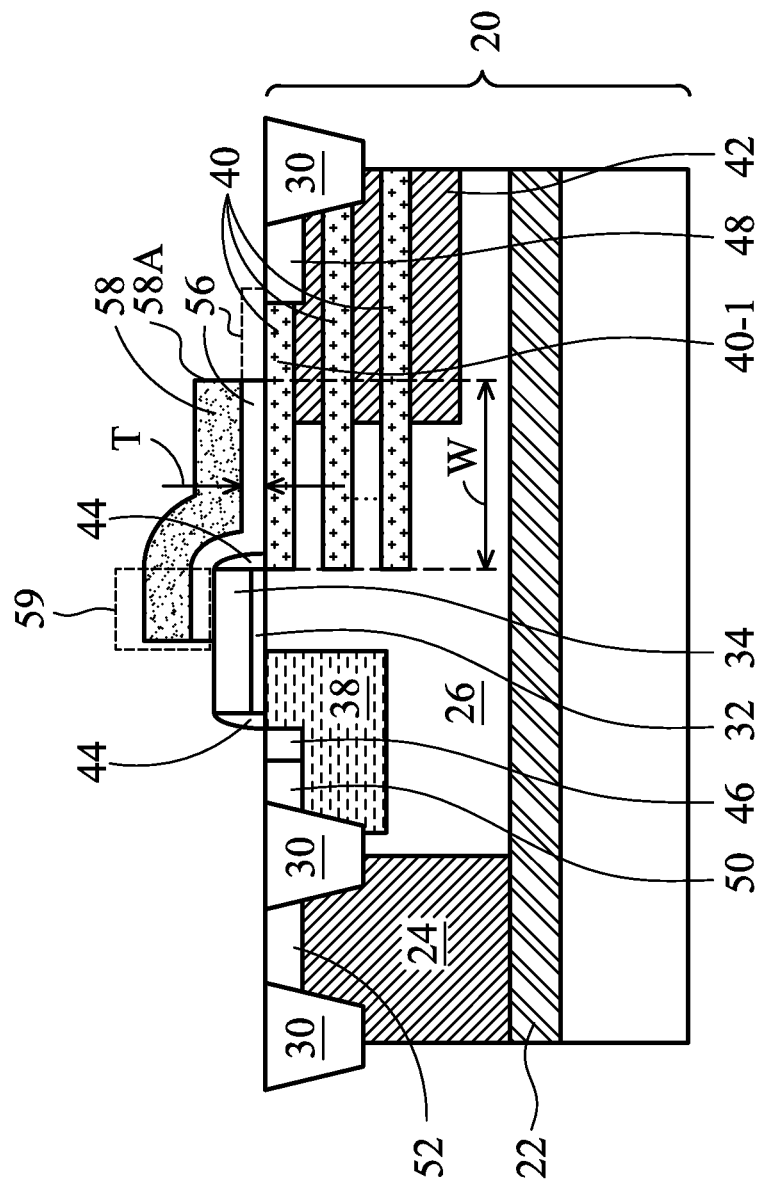
Figure 7:
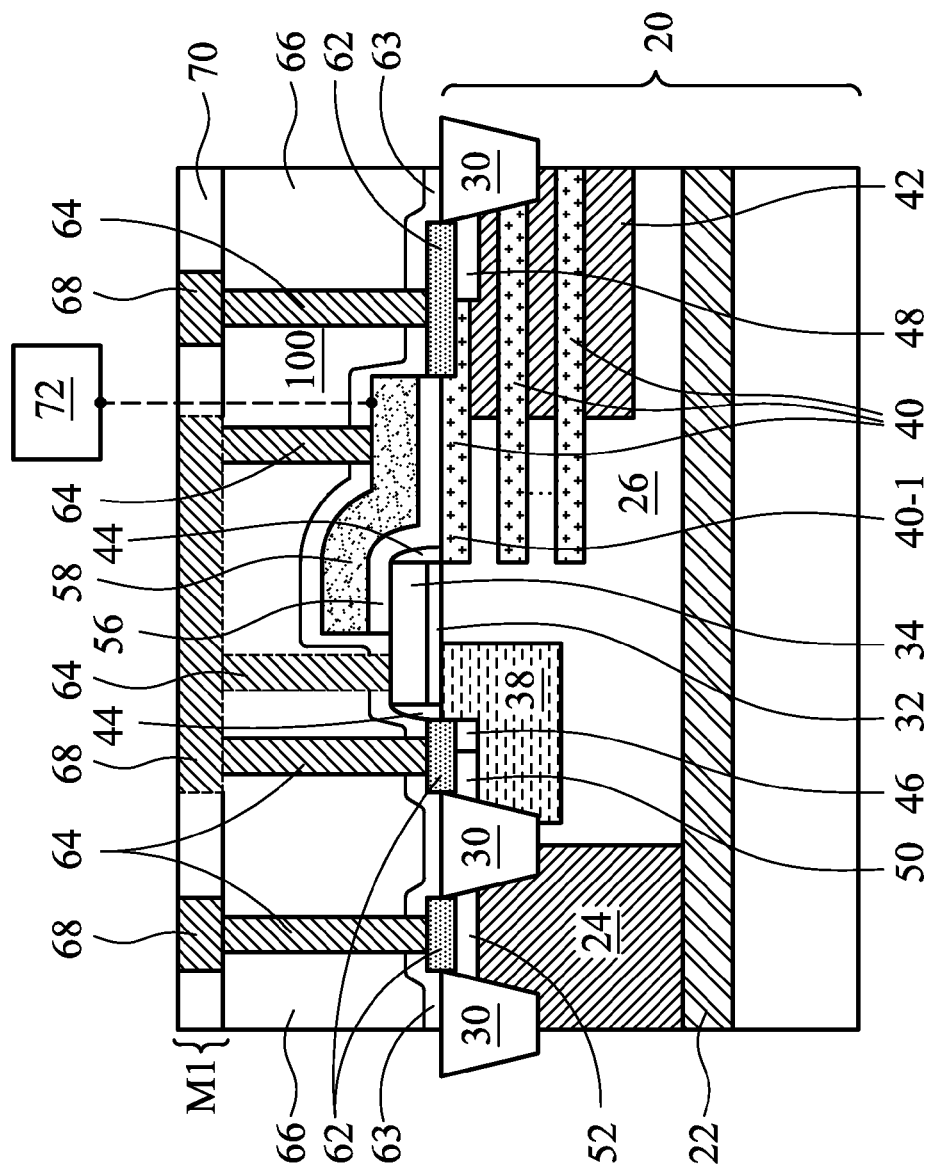

FIG. 6 illustrates the formation of dielectric layer 56 and field plate 58. Dielectric layer 56 may include silicon oxide, silicon nitride, silicon oxynitride, a high-k dielectric material, combinations thereof, or multi-layers thereof. Thickness T of dielectric layer 56 may be between about 100 Å and about 2,500 Å, although different thicknesses may be used. Thickness T of dielectric layer 56 may be selected based on the desirable breakdown voltage of the respective power MOSFET 100 (FIG. 7). A higher breakdown voltage requires a greater thickness T, and a lower breakdown voltage requires a smaller thickness T. Dielectric layer 56 may be a substantially conformal layer, wherein the thicknesses of the horizontal portions of dielectric layer 56 are substantially equal to the thickness of the vertical portion of dielectric layer 56 on the sidewall of gate spacer 44. Furthermore, dielectric layer 56 may include a first portion over and aligned to gate electrode 34, and a second portion over and aligned to N-type drift regions 40. The top surface of the first portion may be higher than the top surface of the second portion of dielectric layer 56. The bottom surface of the first portion of dielectric layer 56 may be in physical contact with the top surface of gate electrode 34. The bottom surface of the second portion of dielectric layer 56 may be in physical contact with the top surface of N-type drift region 40-1.

Field plate 58 comprises a conductive material such as polysilicon, a metal, a metal silicide, or the like. Field plate 58 includes a portion over and aligned to a portion of N-type drift regions 40. In some embodiments, dielectric layer 56 and field plate 58 do not include any portion over and aligned to gate electrode 34. Accordingly, the portions of dielectric layer 56 and field plate 58 in the dashed region 59 may not exist. Alternatively, dielectric layer 56 and field plate 58 include portions over and aligned to a part of gate electrode 34. As a result, field plate 58 also includes the first portion over and aligned to gate electrode 34, and a second portion over and aligned to N-type drift regions 40, wherein the top surface of the first portion may be higher than the top surface of the second portion. Gate electrode 34 also includes a portion (which is closer to the source side than to the drain side) not vertically aligned to field plate 58, so that a contact plug may be formed to access gate electrode 34. In some exemplary embodiments, the overlapping width W of field plate 58 and N-type drift regions 40 may be greater than about 0.5 μm. Field plate 58 has edge 58A, which may be spaced apart from drain region 48 by a portion of N-type drift region 40-1.

In some exemplary embodiments, the formation of dielectric layer 56 and field plate 58 comprises blanket forming dielectric layer 56, blanket forming field plate 58 over the blanket dielectric layer 56, and performing an etching step to pattern the blanket dielectric layer 56 and the blanket field plate 58. The patterning of the blanket dielectric layer 56 and the blanket field plate 58 may be performed using a same lithography mask, and hence the edges of field plate 58 are aligned to the respective edges of dielectric layer 56. Alternatively, the patterning of the blanket dielectric layer 56 and the patterning of the blanket field plate 58 are performed using different lithography masks, and hence the edges of field plate 58 are misaligned with the respective edges of dielectric layer 56. For example, the dashed lines shows that the patterned dielectric layer 56 may extend to the right beyond field plate 58.

Referring to FIG. 7, the remaining components of power MOSFET 100 are formed. The exemplary illustrated components include source/drain silicide regions 62. Next, contact etch stop layer 63, contact plugs 64, Inter-Layer Dielectric (ILD) 66, and metal lines 68 in bottom metal layer M1 are formed. It is appreciated that the contact plug 64 connected to gate electrode 34 is in a plane different from the plane shown in FIG. 7, and is not connected to the illustrated metal line 68 that interconnects source 46 and field plate 58. Bottom metal layer M1 is the lowest metal layer of a plurality of metal layers, which may be formed in low-k dielectric layers. For example, metal lines 68 may be formed in low-k dielectric layer 70. In accordance with embodiments, field plate 58 is formed under bottom metal layer M1. Furthermore, the top surfaces of field plate 58 are lower than the top edges of contact plugs 64. Contact plugs 64 may be tungsten plugs in some exemplary embodiments.

In power MOSFET 100, field plate 58 may be connected to source region 46 in accordance with some exemplary embodiments. Accordingly, field plate 58 is also applied with the same voltage as source region 46. In alternative embodiments, field plate 58 is connected to the electrical ground. In yet other embodiments, field plate 58 is connected to a fixed voltage, which may be a voltage ranging from the ground voltage to power supply voltage VDD. The fixed voltage may be provided by voltage source 72, which is electrically coupled to field plate 58.

During the operation of power MOSFET 100, N-well region 24 and NBL 22 may be applied with a fixed bias voltage, which is higher the electrical ground voltage. The bias voltage may also be lower than or close to the normal power supply voltage VDD.

The power MOSFET 100 illustrated in FIG. 7 is an n-type power MOSFET. In accordance with alternative embodiments, a p-type power MOSFET may be formed. The p-type power MOSFET may have a structure similar to the structure shown in FIG. 7, except that the conductivity types of regions 24, 40, 42, 46, 48, 50, and 52, and the like, are inverted from the conductivity types of the like components represented using the like reference numerals.

In the embodiments, by forming field plate 58, the breakdown voltage of power MOSFET 100 is increased. The power MOSFETs including the field plates have breakdown voltage significantly higher than the breakdown voltages of the power MOSFETs not including the field plates. For example, simulation results indicated that a power MOSFET including the field plate has a breakdown voltage equal to about 30 V, and a similar power MOSFET not including the field plate has a breakdown voltage equal to about 15 V. In addition, since N-type drift regions 40 do not vertically overlap gate electrode 34 (FIG. 7), the gate-to-drain capacitance is minimized, resulting in the improved device performance. The formation of the plurality of N-type drift regions 40 form a reduced surface field (RESURF) structure, which helps reduce the electrical field between the corners of gate electrode 34 and N-type drift region 40-1. In the embodiments, N-type drift regions 40 are formed after the formation of gate electrode 34 and gate dielectric 32, accordingly, the thermal budget of N-type drift regions 40 is reduced, and hence the profile of N-type drift regions 40 may be controlled better.

In accordance with embodiments, a power MOSFET includes a semiconductor region extending from a top surface of a semiconductor substrate into the semiconductor substrate, wherein the semiconductor region is of a first conductivity type. A gate dielectric and a gate electrode are disposed over the semiconductor region. A drift region of a second conductivity type opposite the first conductivity type extends from the top surface of the semiconductor substrate into the semiconductor substrate. A dielectric layer has a portion over and in contact with a top surface of the drift region. A conductive field plate is over the dielectric layer. A source region and a drain region are on opposite sides of the gate electrode. The drain region is in contact with the drift region. A bottom metal layer is over the field plate.

In accordance with other embodiments, a power MOSFET includes a semiconductor region at a surface of a semiconductor substrate, wherein the semiconductor region is of a first conductivity type. A gate dielectric is over the semiconductor region. A gate electrode is over the gate dielectric. A first drift region extends from a top surface of the semiconductor substrate into the semiconductor substrate, wherein an edge of the first drift region is substantially aligned to an edge of the gate electrode. A second drift region is under and aligned to the first drift region, wherein a portion of the first drift region and a portion of the second drift region are separated from each other by a region that is of the first conductivity type. The first drift region and the second drift region are of a second conductivity type opposite the first conductivity type. A source region is adjacent to the gate electrode. A drain region contacts the first drift region. The source region and the drain region are on opposite sides of the gate electrode. The drain region is spaced apart from the gate electrode by a portion of the first drift region.

In accordance with yet other embodiments, a method includes forming a gate dielectric over a semiconductor region, wherein the semiconductor region is of a first conductivity type. A gate electrode is formed over the gate dielectric. After the step of forming the gate electrode, the semiconductor region is implanted to form a first drift region, wherein an edge of the first drift region is aligned to an edge of the gate electrode. The semiconductor region is implanted to form a second drift region vertically aligned to and underlying the first drift region. The first and the second drift regions are of a second conductivity type opposite the first conductivity type, and are spaced apart from each other by a portion of the semiconductor region. A source region is formed on a first side of the gate electrode. A drain region is formed on a second side of the gate electrode. The drain region extends into a first portion of the first drift region, and is spaced apart from the gate electrode by a second portion of the first drift region.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A power Metal-Oxide-Semiconductor Field-Effect Transistor (MOSFET) comprising:
    a semiconductor substrate;
    a semiconductor region extending from a top surface of the semiconductor substrate into the semiconductor substrate, wherein the semiconductor region is of a first conductivity type;
    a gate dielectric over the semiconductor region;

a gate electrode over the gate dielectric;
a first drift region extending from the top surface of the semiconductor substrate into the semiconductor substrate, wherein the first drift region is of a second conductivity type opposite the first conductivity type;
a dielectric layer comprising:
  a first portion over and in contact with a top surface of the first drift region; and
  a second portion over and in contact with a top surface of the gate electrode;
a field plate over the dielectric layer, wherein the field plate is conductive, and comprises:
  a first portion over the first portion of the dielectric layer; and
  a second portion over and in contact with a top surface of the second portion of the gate dielectric;
a source region on a first side of the gate electrode;
a drain region on a second side of the gate electrode opposite the first side, wherein the drain region is in contact with the first drift region; and
a bottom metal layer over the field plate.

2. The power MOSFET of claim 1, wherein the second portion of the field plate has a top surface higher than a top surface of the first portion of the field plate.

3. The power MOSFET of claim 1, wherein the dielectric layer and the field plate do not comprise portions directly over the gate electrode, and wherein portions of the dielectric layer and the field plate are at a same level as the gate dielectric and the gate electrode.

4. The power MOSFET of claim 1, wherein an edge of the first drift region is substantially aligned to an edge of the gate electrode.

5. The power MOSFET of claim 1 further comprising a second drift region under and vertically aligned to the first drift region, wherein the second drift region is of the second conductivity type, and wherein the first and the second drift regions are spaced apart from each other by a region that is of the first conductivity type.

6. The power MOSFET of claim 5, wherein the second drift region is electrically floating.

7. The power MOSFET of claim 5 further comprising a well region of the second conductivity type contacting both the first and the second drift regions.

8. The power MOSFET of claim 1, wherein the field plate is electrically connected to the source region.

9. The power MOSFET of claim 1, wherein the field plate is electrically connected to an electrical ground.

10. A power Metal-Oxide-Semiconductor Field-Effect Transistor (MOSFET) comprising:
  a semiconductor substrate;
  a semiconductor region at a surface of the semiconductor substrate, wherein the semiconductor region is of a first conductivity type;
  a gate dielectric over the semiconductor region;
  a gate electrode over the gate dielectric;
  a first drift region extending from a top surface of the semiconductor substrate into the semiconductor substrate, wherein an edge of the first drift region is substantially aligned to an edge of the gate electrode;
  a second drift region under and aligned to the first drift region, wherein a portion of the first drift region and a portion of the second drift region are separated from each other by a region that is of the first conductivity type, wherein the first drift region and the second drift region are of a second conductivity type opposite the first conductivity type, wherein an entirety of the second drift region is separated from an entirety of the first drift region by the region of the first conductivity type, and wherein no region of the second conductivity type interconnects the first drift region and the second drift region;
  a source region adjacent to the gate electrode; and
  a drain region contacting the first drift region, wherein the source region and the drain region are on opposite sides of the gate electrode, and wherein the drain region is spaced apart from the gate electrode by a portion of the first drift region.

11. The power MOSFET of claim 10 further comprising a well region of the second conductivity type, wherein the well region electrically interconnects the first drift region and the second drift region.

12. The power MOSFET of claim 10 further comprising:
  a dielectric layer comprising a portion over and in contact with a top surface of the first drift region;
  a field plate over the dielectric layer, wherein the field plate is conductive, and comprises a portion over and aligned to the portion of the dielectric layer; and
  a bottom metal layer over the field plate.

13. A power Metal-Oxide-Semiconductor Field-Effect Transistor (MOSFET) comprising:
  a semiconductor substrate;
  a semiconductor region extending from a top surface of the semiconductor substrate into the semiconductor substrate, wherein the semiconductor region is of a first conductivity type;
  a gate dielectric over the semiconductor region;
  a gate electrode over the gate dielectric;
  a first drift region extending from the top surface of the semiconductor substrate into the semiconductor substrate, wherein the first drift region is of a second conductivity type opposite the first conductivity type;
  a second drift region under and vertically aligned to the first drift region, wherein the second drift region is of the second conductivity type, and wherein the first and the second drift regions are spaced apart from each other by a region that is of the first conductivity type;
  a dielectric layer comprising a first portion over and in contact with a top surface of the first drift region;
  a field plate over the dielectric layer, wherein the field plate is conductive, and comprises a first portion over the first portion of the dielectric layer;
  a source region on a first side of the gate electrode;
  a drain region on a second side of the gate electrode opposite the first side, wherein the drain region is in contact with the first drift region; and
  a bottom metal layer over the field plate.

14. The power MOSFET of claim 13, wherein the dielectric layer further comprises a second portion over and in contact with a top surface of the gate electrode, and wherein the field plate further comprises a second portion over and in contact with a top surface of the second portion of the gate dielectric.

15. The power MOSFET of claim 14, wherein the second portion of the field plate has a top surface higher than a top surface of the first portion of the field plate.

16. The power MOSFET of claim 13, wherein the dielectric layer and the field plate do not comprise portions directly over the gate electrode, and wherein portions of the dielectric layer and the field plate are at a same level as the gate dielectric and the gate electrode.

17. The power MOSFET of claim 13, wherein an edge of the first drift region is substantially aligned to an edge of the gate electrode.

18. The power MOSFET of claim 13 further comprising a well region of the second conductivity type contacting both the first and the second drift regions.

19. The power MOSFET of claim 13, wherein the field plate is electrically connected to the source region.

20. The power MOSFET of claim 13, wherein no region of the f conductivity type interconnects the first drift region and the second drift region.

* * * * *

UNITED STATES PATENT AND TRADEMARK OFFICE
CERTIFICATE OF CORRECTION

PATENT NO.        : 8,664,718 B2
APPLICATION NO.   : 13/348463
DATED             : March 4, 2014
INVENTOR(S)       : Chih-Chang Cheng Page 1 of 1

It is certified that error appears in the above-identified patent and that said Letters Patent is hereby corrected as shown below:

In the Claims:

In Col. 9, line 7, claim 20, delete "f conductivity" and insert --first conductivity--.

Signed and Sealed this
Thirteenth Day of May, 2014

Michelle K. Lee
*Deputy Director of the United States Patent and Trademark Office*